US009390638B2

(12) United States Patent
Broadbent

(10) Patent No.: US 9,390,638 B2
(45) Date of Patent: Jul. 12, 2016

(54) ARTICLE WITH TRANSLUCENT ORNAMENTATION

(71) Applicant: Joseph Broadbent, Sracey, MN (US)

(72) Inventor: Joseph Broadbent, Sracey, MN (US)

( * ) Notice: Subject to any disclaimer, the term of this patent is extended or adjusted under 35 U.S.C. 154(b) by 102 days.

(21) Appl. No.: 13/911,811

(22) Filed: Jun. 6, 2013

(65) Prior Publication Data

US 2014/0362585 A1 Dec. 11, 2014

(51) Int. Cl.

*H01L 25/13* (2006.01)
*G09F 13/08* (2006.01)
*F21V 33/00* (2006.01)
*F21Y 101/02* (2006.01)

(52) U.S. Cl.

CPC ............ *G09F 13/08* (2013.01); *F21V 33/0032* (2013.01); *F21Y 2101/02* (2013.01); *Y10T 29/49826* (2015.01)

(58) Field of Classification Search

CPC ... F21V 3/04; F21V 33/0032; F21Y 2101/02; G02B 6/0055; G09F 13/08
USPC .......................................................... 362/615
See application file for complete search history.

(56) References Cited

U.S. PATENT DOCUMENTS 1,992,882 A 9/1931 Ovenhauusen
2,464,368 A 2/1946 Barnes
4,025,663 A 5/1977 Brandt
4,236,191 A 11/1980 Martinez
5,118,138 A * 6/1992 Brotz ............................. 281/51
5,439,538 A 8/1995 Perry
5,796,025 A 8/1998 Haake
6,428,875 B1 8/2002 Takahashi et al.
6,543,163 B1 4/2003 Ginsberg
6,547,419 B1 4/2003 Brackman
7,090,380 B2 8/2006 Gerfers
7,097,913 B2 8/2006 Yuzawa et al.
7,399,091 B2 7/2008 Lockett et al.
7,918,579 B2 4/2011 Hamar et al.
7,942,542 B1 * 5/2011 Dunn ...................... G09F 13/16 362/604
2004/0114344 A1 * 6/2004 Burtsev ................ G02B 6/0001 362/604
2006/0265919 A1 * 11/2006 Huang ............................ 40/546
2007/0019271 A1 1/2007 Schrunk
2007/0201242 A1 * 8/2007 Shimura ....................... 362/600
2007/0247870 A1 * 10/2007 Sakai .................. G02B 6/0068 362/612
2008/0005981 A1 1/2008 Jacobsson
2008/0099140 A1 5/2008 Wardein
2009/0058118 A1 3/2009 Hein et al.
2009/0103312 A1 * 4/2009 Batson ..................... 362/311.13
2010/0110725 A1 * 5/2010 Chang .................. G02B 6/0036 362/608
2010/0139874 A1 6/2010 Sudano et al.
2011/0002138 A1 1/2011 Hayes et al.
2012/0057369 A1 * 3/2012 Kim ........................ G09F 13/22 362/612
2013/0077300 A1 * 3/2013 Meyer ....................... F21K 9/50 362/235

FOREIGN PATENT DOCUMENTS

DE 102004044035 B4 5/2007
DE 102009041244 A1 9/2009

(Continued)

*Primary Examiner* — Tracie Y Green
(74) *Attorney, Agent, or Firm* — Berggren Law Offices, LLC; William B. Berggren; Stephen F. Wolf

(57) ABSTRACT

The Article with Translucent Ornamentation comprises: a Sheet having a Front surface and Rear surface. Voids, referred to as cavities, in the sheet provide for passage of light, from lighting system, through the cavities, to the front surface. The Voids control the intensity of the light impinging on the front surface and thereby create light patterns on the front surface.

12 Claims, 11 Drawing Sheets

(56) References Cited

FOREIGN PATENT DOCUMENTS

| | | | |
|---|---|---|---|
| FR | 2920717 | | 9/2007 |
| GB | 456213 | A1 | 5/1935 |
| JP | 2002205500 | A1 | 4/2001 |
| JP | 4578110 | B2 | 1/2004 |
| WO | 2007081254 | A1 | 12/2006 |
| WO | 2008136039 | A1 | 5/2008 |
| WO | 2009110870 | A1 | 8/2008 |

* cited by examiner

12

11

ARTICLE WITH TRANSLUCENT ORNAMENTATION

CROSS REFERENCE TO RELATED APPLICATIONS

There are no applications related to this application.

STATEMENT REGARDING FEDERALLY SPONSORED RESEARCH OR DEVELOPMENT

No invention claimed in this application was made under Federally sponsored research or development.

THE NAMES OF THE PARTIES TO A JOINT RESEARCH AGREEMENT

Not Applicable

REFERENCE TO A SEQUENCE LISTING

Not Applicable

BACKGROUND OF THE INVENTION

1. Field of the Invention

The present invention pertains to the art of panels which are partially opaque and partially translucent or transparent for the purpose of decoration or masking.

2. Description of Related Art

A number of inventions exist which achieve the purpose of masking, often finding uses in the field of semiconductor manufacture. Typical of these are patents to Hiroshi et al (U.S. Pat. No. 4,578,110), and Mercer et al (UK Patent No. 456213). These are typically constructed of opaque and transparent materials affording sharp contrasts while the present invention is constructed of sheet of translucent material.

Another set of inventions exist which are flooring systems typically of a mixture of opaque and transparent or translucent panels which produce patterns by the relative placement of the panels. Typical of these are Jacobsson (Patent Application No. 2008000598), and Hamar et al (U.S. Pat. No. 7,918,579). The present invention develops its patterns by varying the thickness of material through which the light must pass.

A third class of inventions attempts to create artistic lighting effects by reducing the thickness of a veneer to the point of translucency to reveal the natural patterns in the veneer material, usually wood. Typical of this class are Ovenhausen (U.S. Pat. No. 1,992,882), and Brackman (U.S. Pat. No. 6,547,419). Again, the present invention develops its patterns by varying the thickness of material through which the light must pass.

BRIEF SUMMARY OF THE INVENTION

The Article with Translucent Ornamentation comprises: a Sheet having a Front surface and Rear surface, a lighting system; and one or more cavities in said Sheet. Each of said cavities extending from said Rear surface toward said Front surface sufficiently close to said Front surface to permit the passage of a portion of the light from the lighting system to pass through said cavity, and said Front surface. The passage of light, from the lighting system, through the cavities, while the light is blocked by the Sheet where no cavities are present, produces a light pattern on said Front surface.

FIRST ALTERNATE EMBODIMENT

Figures 1, 1A, 1B:
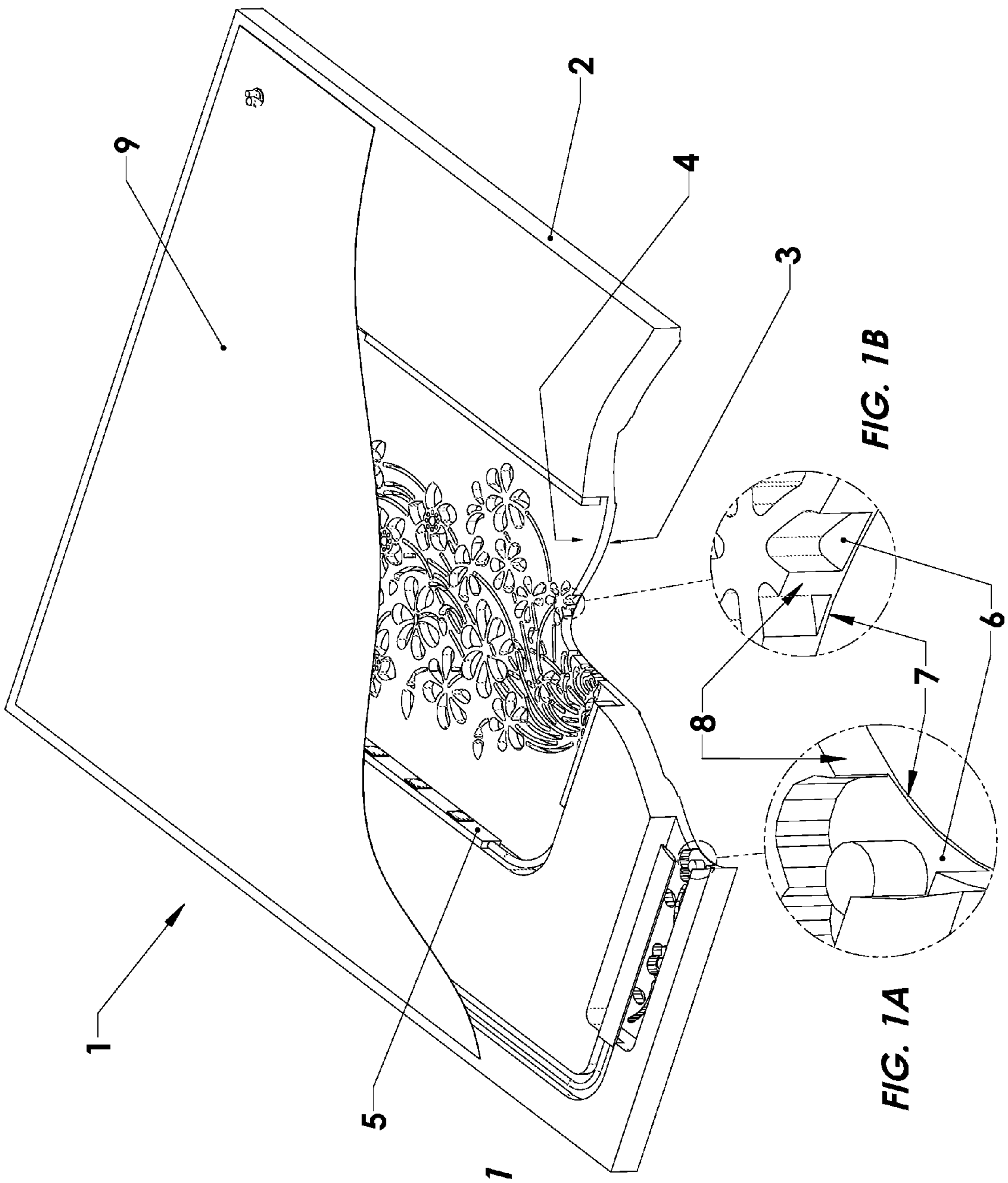
FIG. 1 is a cutaway perspective view of the Article with Translucent Ornamentation showing sheet and lighting source.
FIG. 1A is a detailed view of the Article with Translucent Ornamentation of FIG. 1. showing a light cavity.
FIG. 1B is an alternate detailed view of the Article with Translucent Ornamentation of FIG. 1 showing a light cavity.
Figures 2, 2A, 2B:
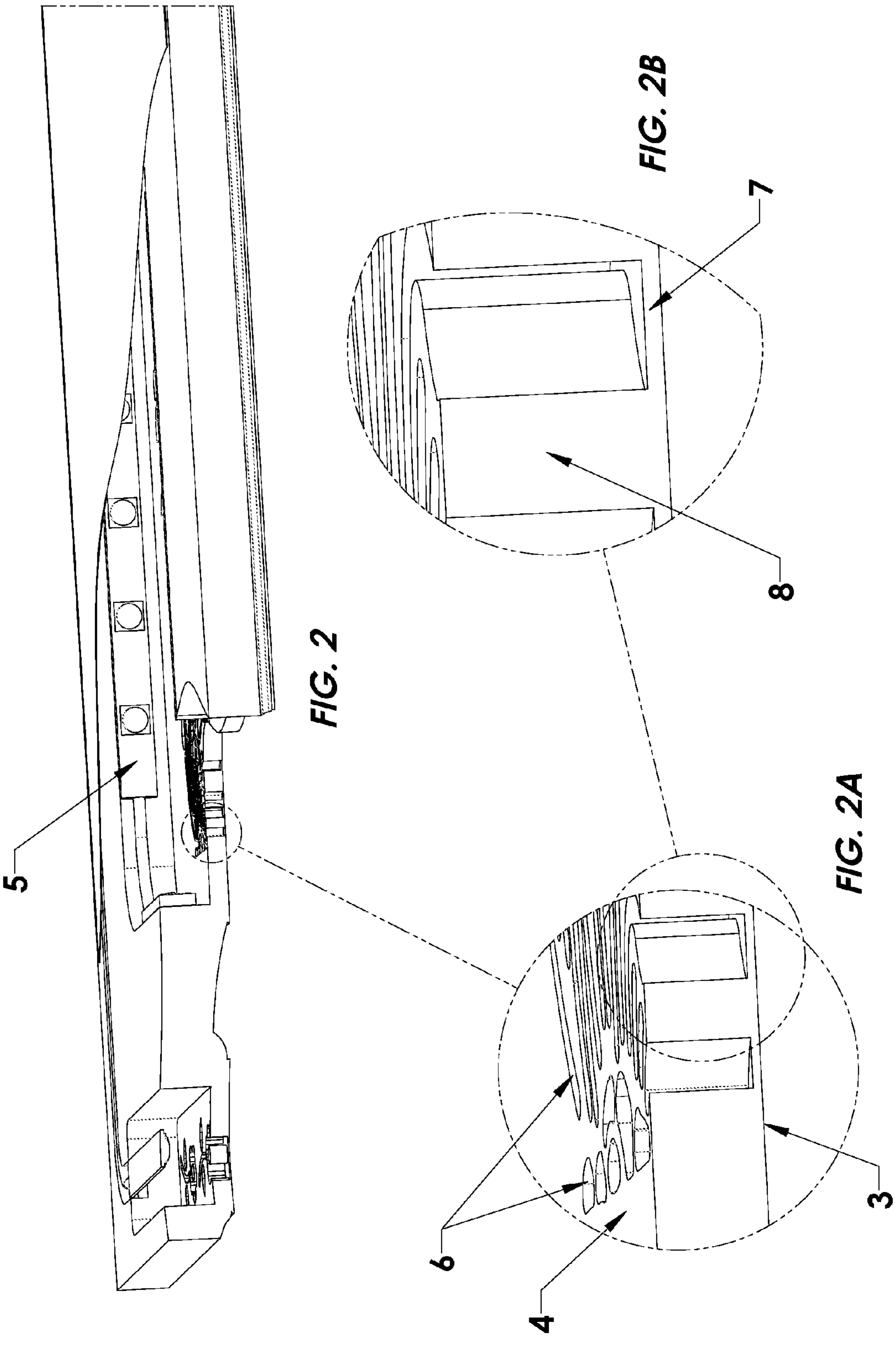
FIG. 2 is a cutaway perspective view of the Article with Translucent Ornamentation of FIG. 1. showing a light compartment containing a light source.
FIG. 2A is a cutaway detailed view of the Article with Translucent Ornamentation of FIG. 2 showing light cavities.
FIG. 2B is a cutaway detailed view of the Article with Translucent Ornamentation of FIG. 2 showing a light cavity.
Figure 4:
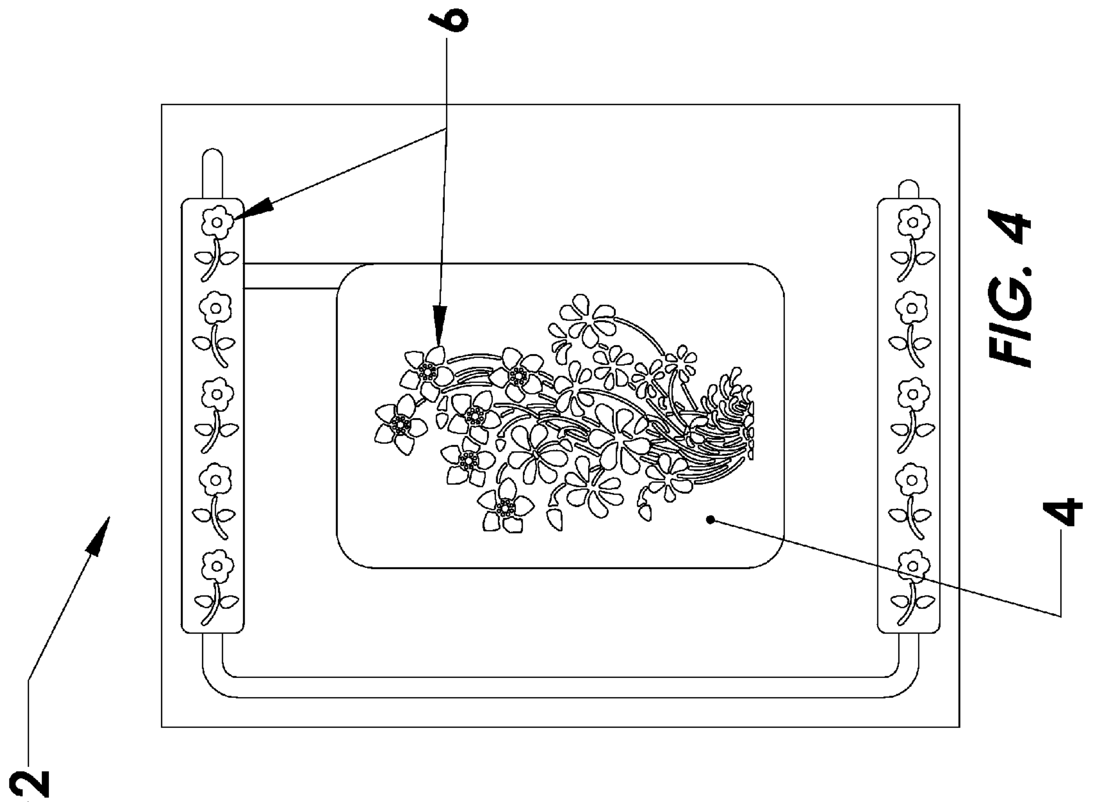
FIG. 4 is a rear perspective view of the Article with Translucent Ornamentation, of FIG. 2, showing lighting compartments and cavities.
Figure 3:
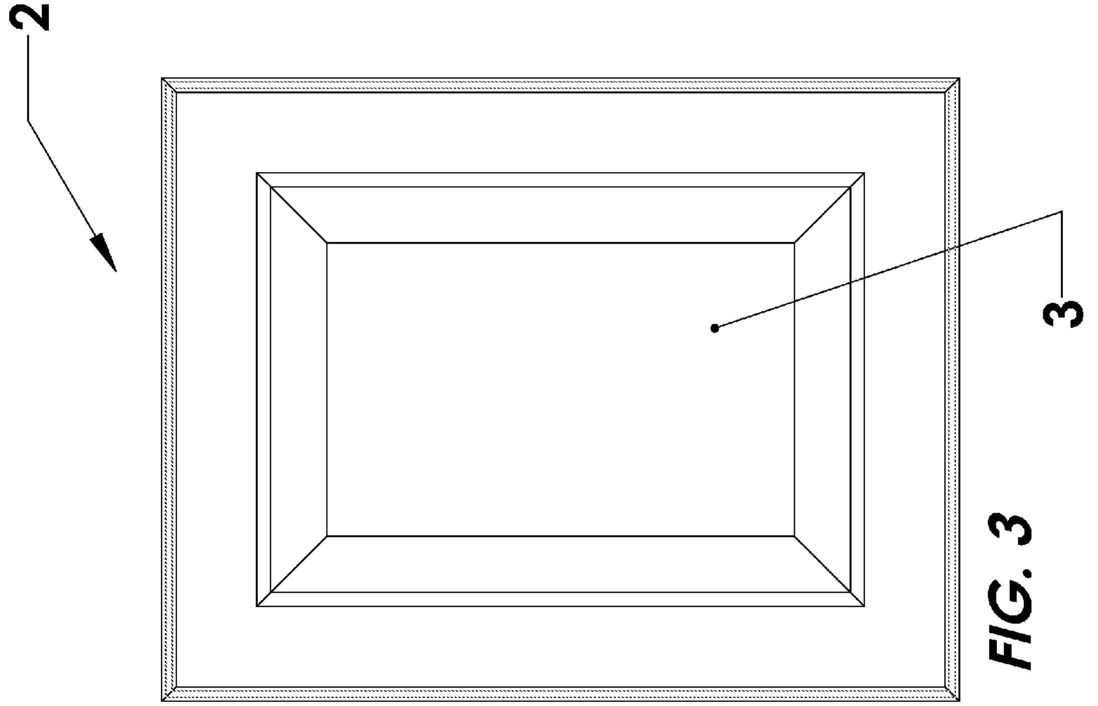
FIG. 3 is a front perspective view of the Article with Translucent Ornamentation, of FIG. 2, showing no evidence of the compartments or cavities.
Figure 5:
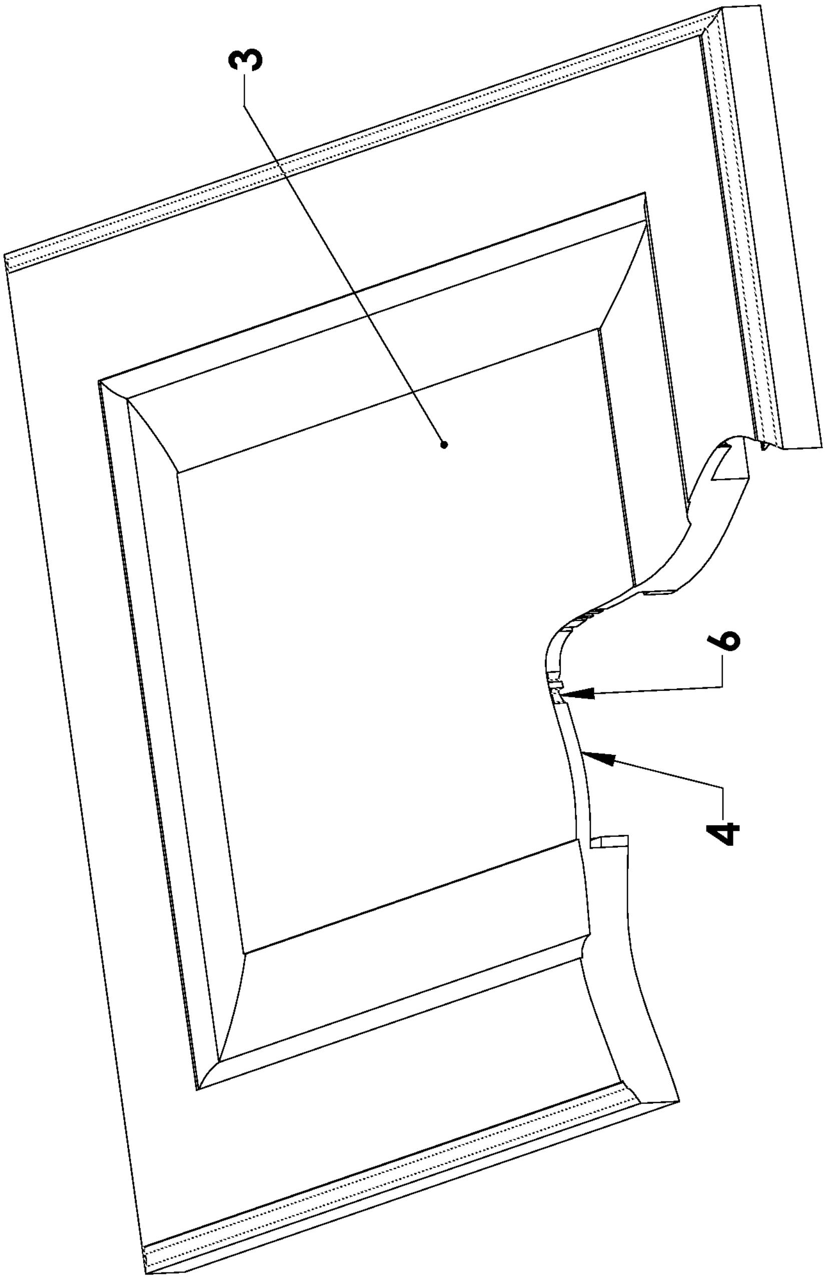
FIG. 5 is a cutaway perspective view of the Article with Translucent Ornamentation of FIG. 2 showing the front or prominent surface.
Figure 6:
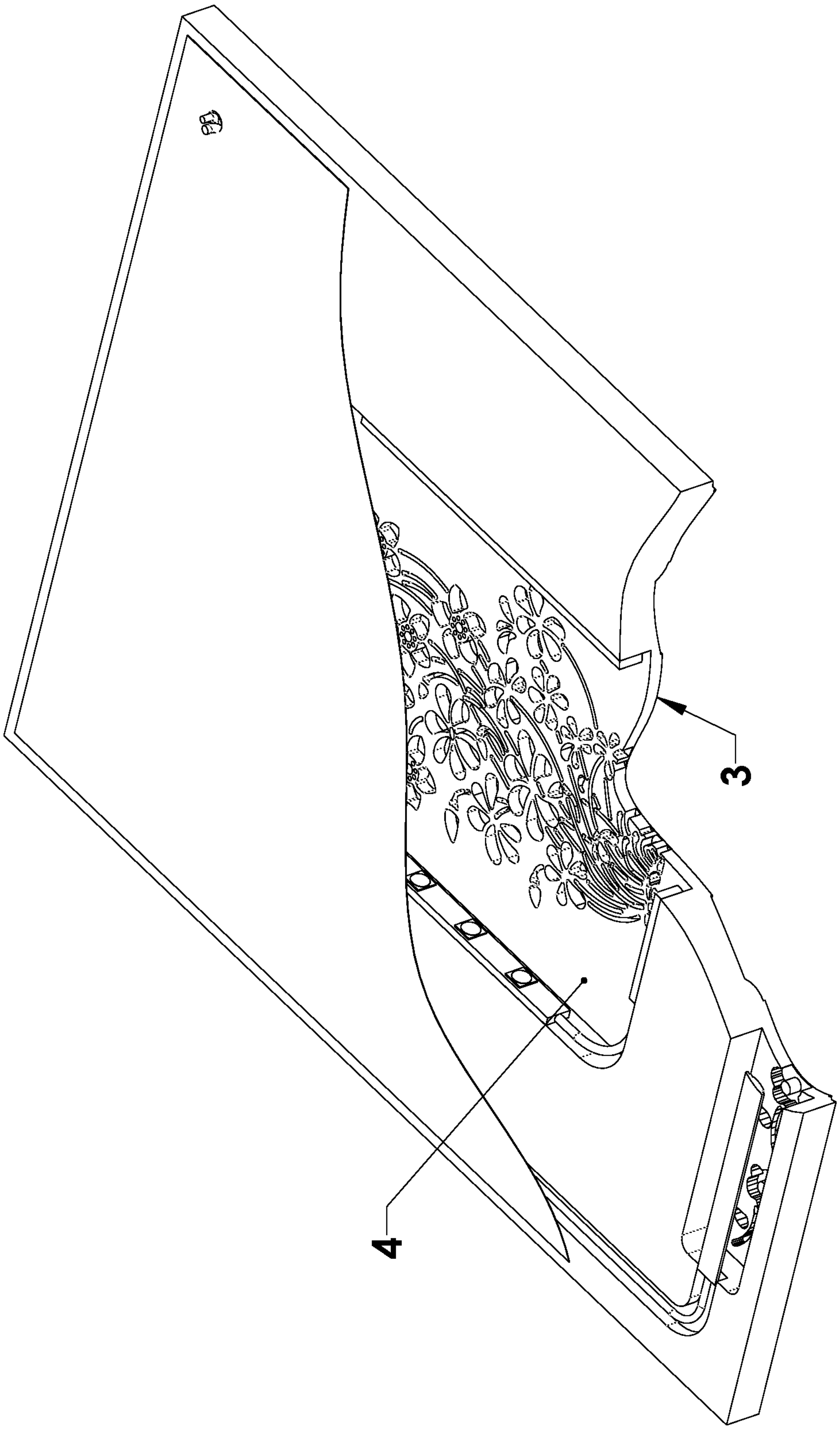
FIG. 6 is a cutaway perspective of the Article with Translucent Ornamentation of FIG. 2 showing a lighting compartment.
Figures 7, 7A, 7B:
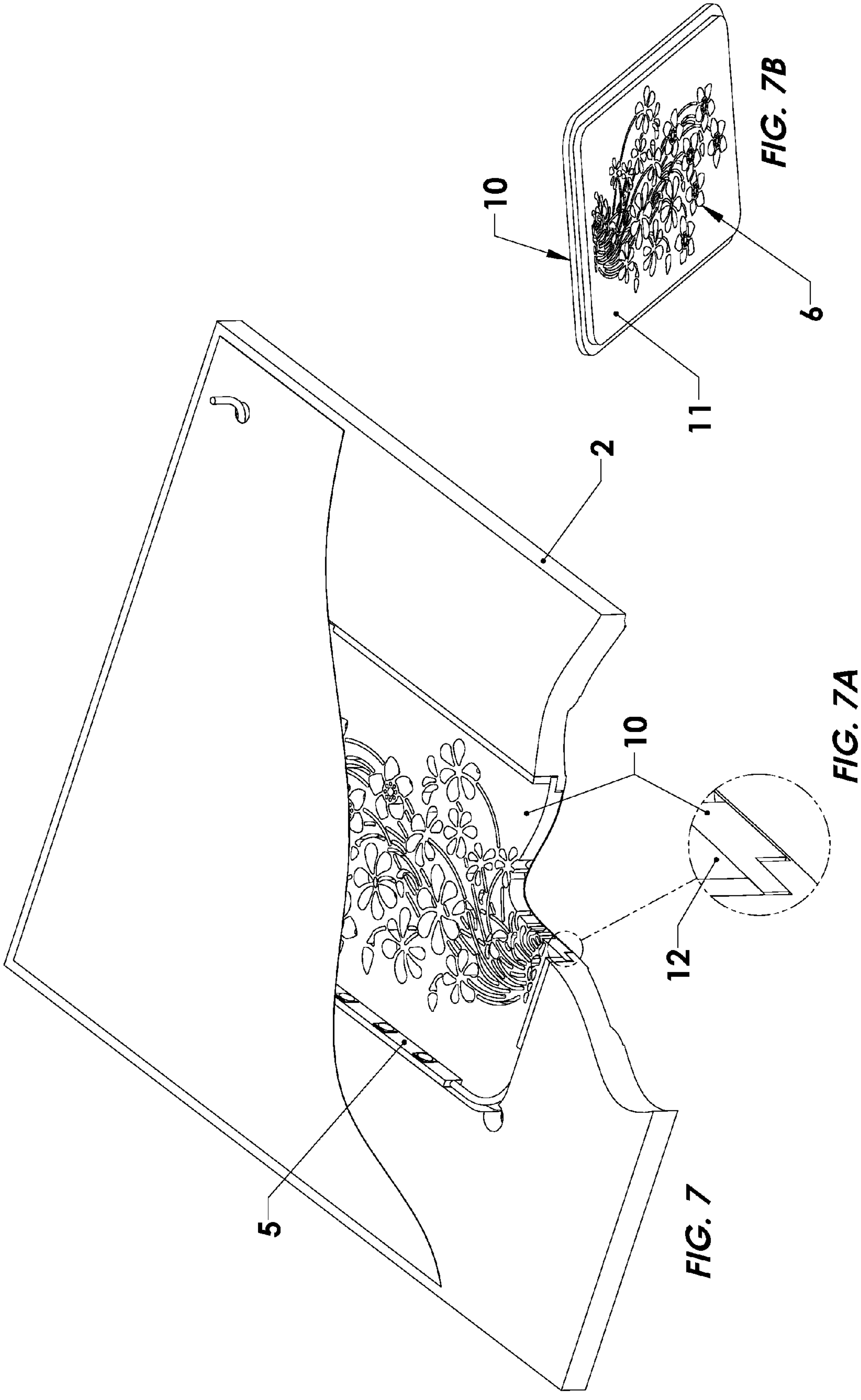

FIG. 7 is a cutaway perspective view of an alternate embodiment of the Article with Translucent Ornamentation.

FIG. 7A is a cutaway detailed view of the Article with Translucent Ornamentation of FIG. 7 showing an insert.

FIG. 7B is a perspective view of an insert in accordance with certain embodiments of the Article with Translucent Ornamentation.

Figure 8:
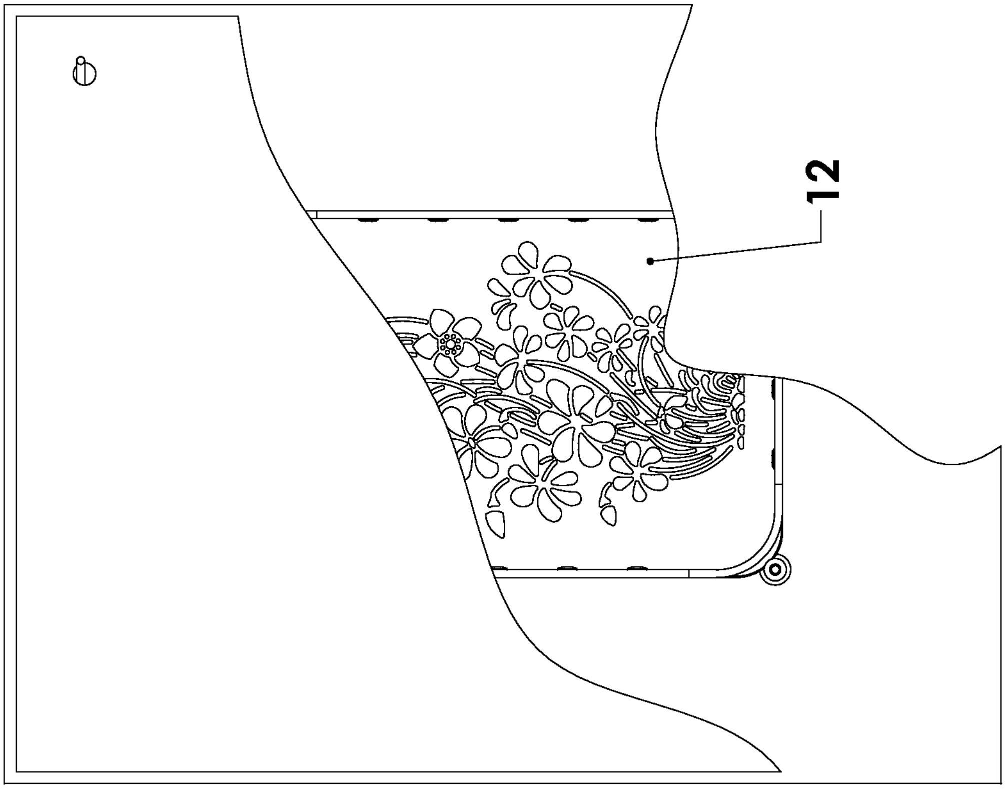

FIG. 8 is a cutaway rear view of the Article with Translucent Ornamentation of FIG. 7.

Figure 9:
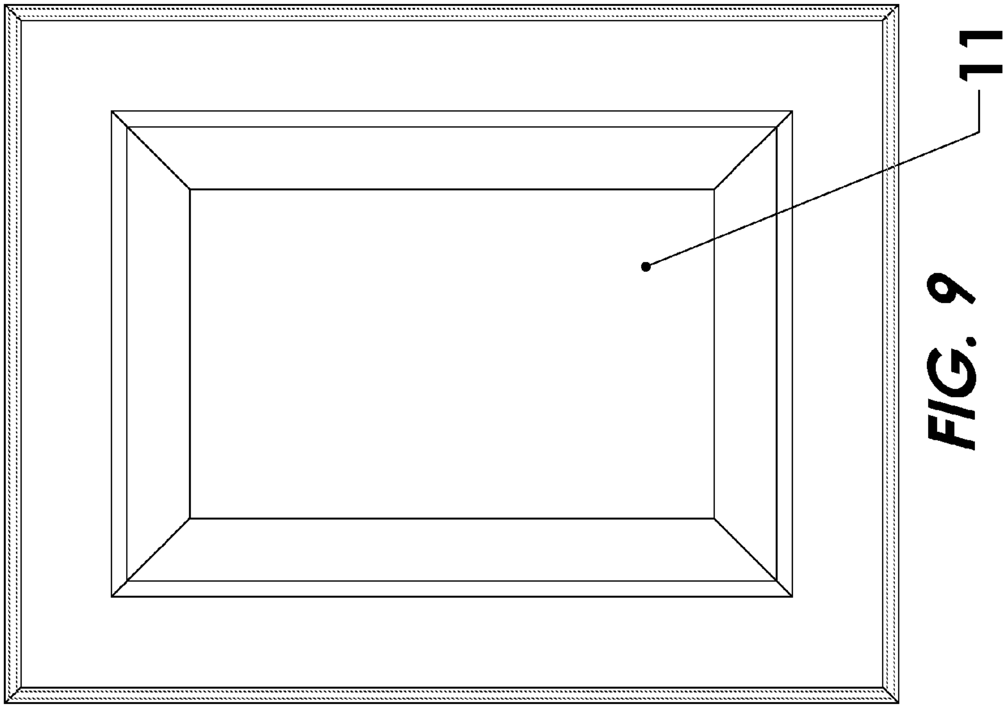

FIG. 9 is a front view of the Article with Translucent Ornamentation of FIG. 7 showing no evidence of lighting compartments and cavities.

Figure 10:
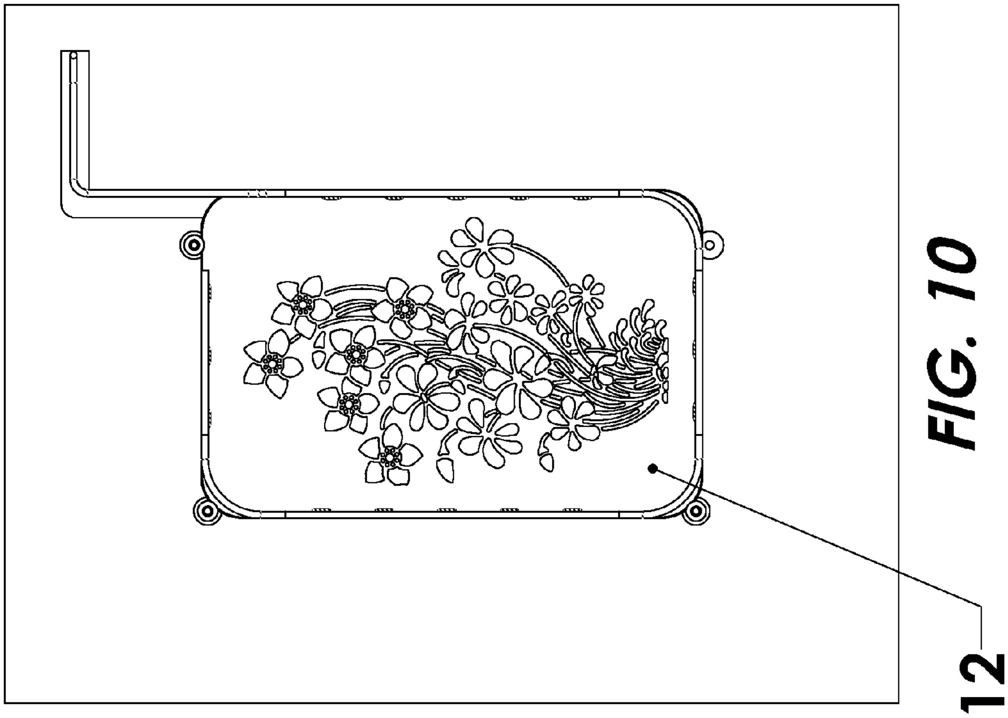

FIG. 10 is a rear view of the Article with Translucent Ornamentation of FIG. 7 showing lighting compartments and cavities.

Second Alternate Embodiment

Figure 11A:
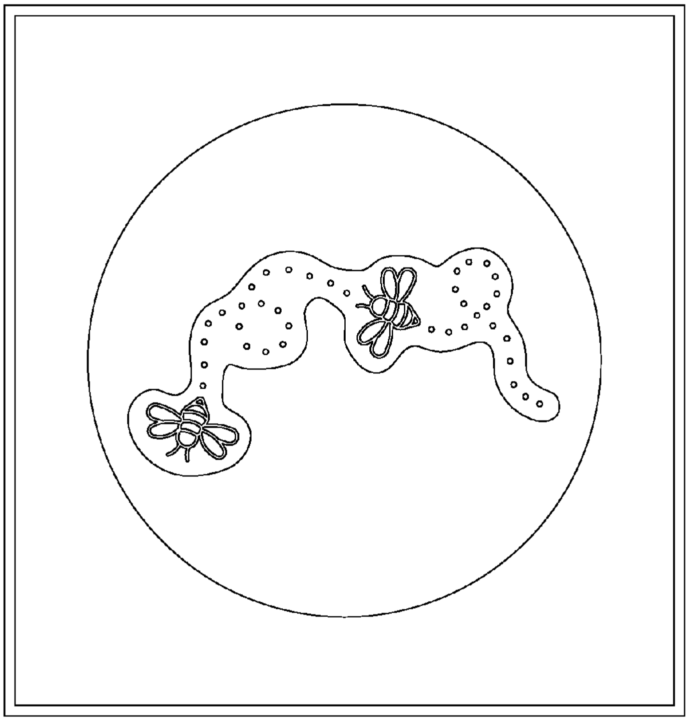
Figure 11:
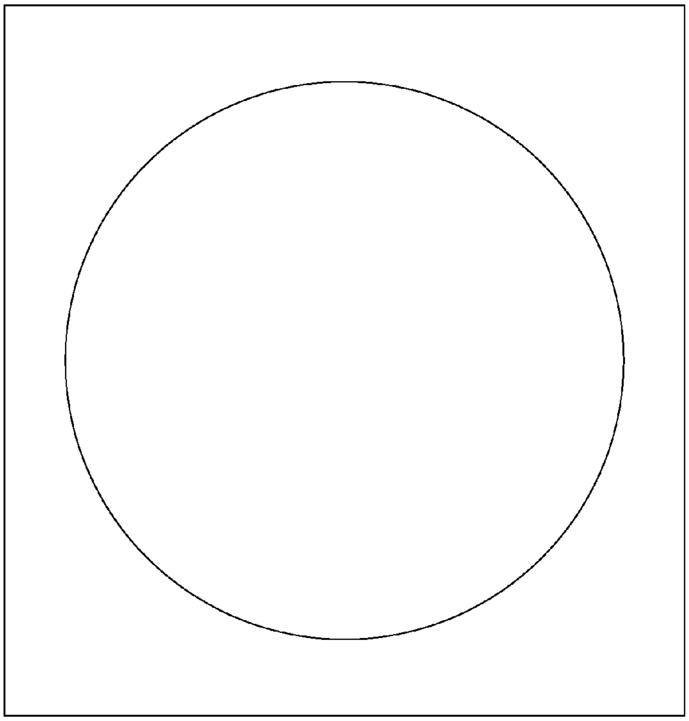

FIG. 11 is a front view of an alternate embodiment of the Article with Translucent Ornamentation showing no evidence of the lighting compartments or cavities.

FIG. 11A is a rear view of an alternate embodiment of the Article with Translucent Ornamentation of FIG. 11 showing lighting compartments and cavities.

Figure 12:
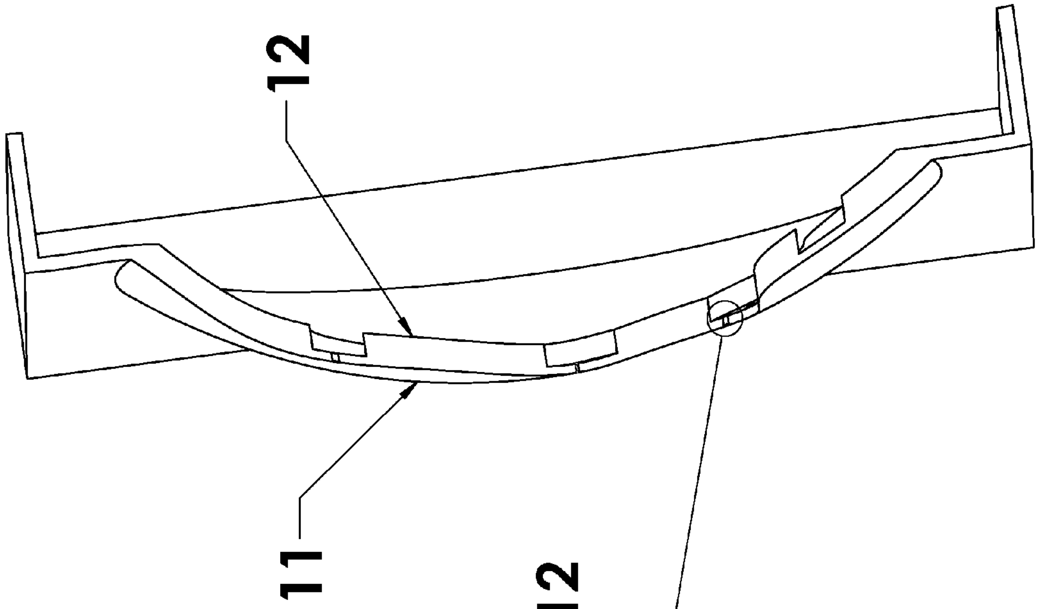

FIG. 12 is a cutaway perspective view of an alternate embodiment of the Article with Translucent Ornamentation from FIG. 11.

Figure 12A:
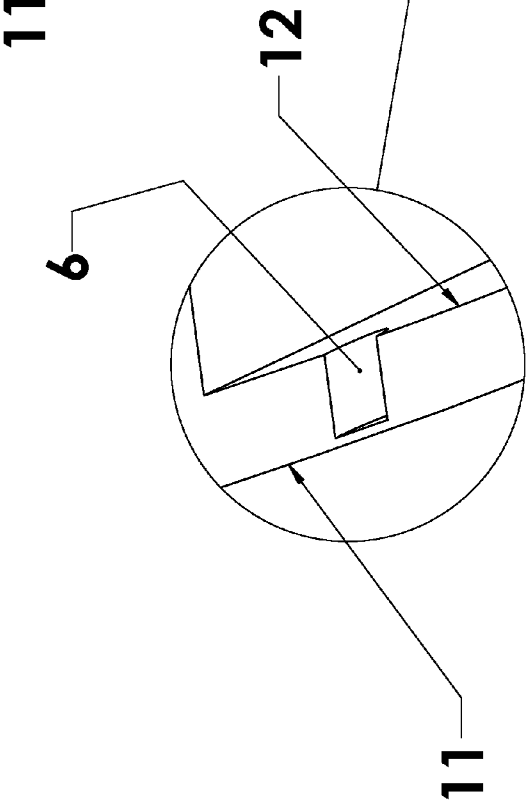

FIG. 12A is a detailed view of an alternate embodiment of the Article with Translucent Ornamentation of FIG. 12 showing a lighting compartment with light cavity.

Figure 13:
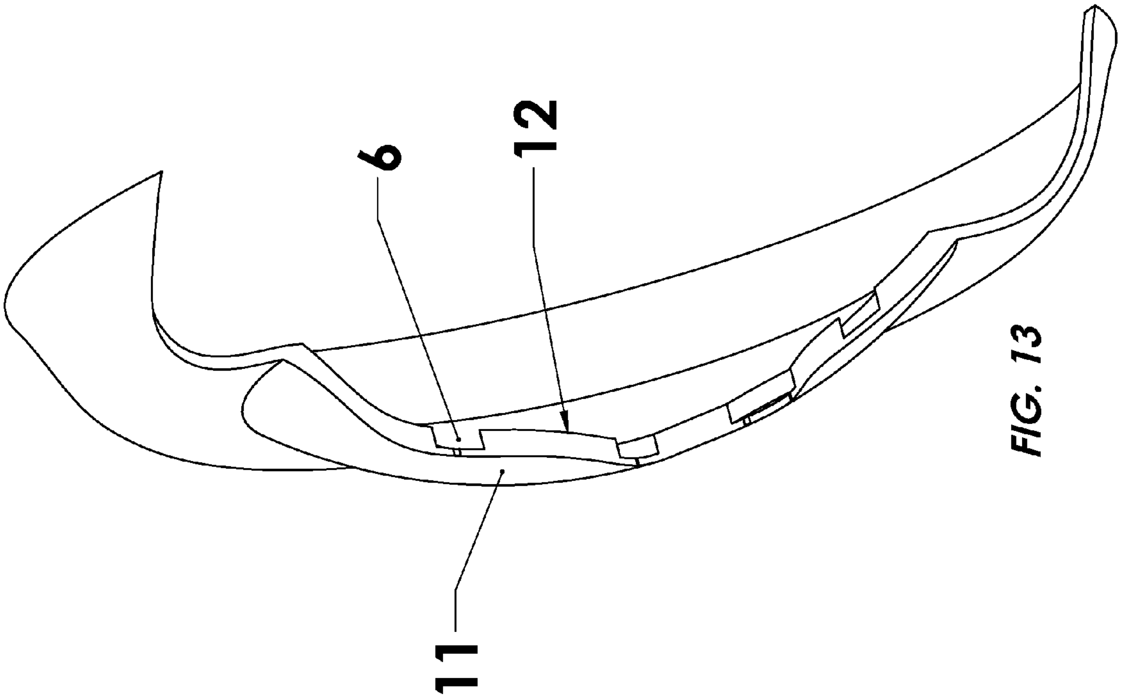

FIG. 13 is a cutaway perspective view of the Article with Translucent Ornamentation of FIG. 11 demonstrating non planar surfaces.

DETAILED DESCRIPTION OF THE INVENTION

The Article with Translucent Ornamentation 1 comprises: a Sheet 2 having a Front surface 3 and Rear surface 4, a lighting system 5; and one or more cavities 6 in said Sheet 2. Each of said cavities 6 extending from said Rear surface 4 toward said Front surface 3 sufficiently close to said Front surface 3 to permit the passage of a portion of the light from the lighting system 5 to pass through said cavity 6, and said Front surface 3. The passage of light, from the lighting system 5, through the cavities 6, while the light is blocked by the Sheet 2 where no cavities 6 are present, produces a light pattern on said Front surface 3.

The Sheet 2 may be constructed of any material which is translucent and which can be cast, machined or otherwise shaped. Such material must be able to transmit substantially more light when thin and less light when thick. The Sheet 2 includes a front surface 3 and a Rear surface 4. In one embodiment the Front surface 3 remains relatively smooth and unbroken while the Rear surface 4 includes any number of cavities 6 which penetrate the Rear surface 4. The Sheet 2 may be of any form or size so long as, when illuminated, with the lighting system 5, and provided with a number of cavities 6, a pattern of light and dark is provided on the Front surface 3. In one embodiment the Sheet 2 is a relatively thin rectangular shape. In another the Sheet 2 may be cylindrical in shape. In yet another embodiment the Sheet 2 may be spherical. It will be readily appreciated the Sheet 2 may be of any shape so long as the Rear surface 4 of the Sheet 2 can be cast or machined to include a number of cavities 6.

The lighting system 5 is any lighting system 5 which produces sufficiently bright light so that light will pass through the thin areas 7 of the Sheet 2, yet not so bright that the light would pass through the thickest areas 8 of the Sheet 2. In one embodiment of the invention the transmissivity of the Sheet 2 material is uniformly proportional the thickness of the Sheet 2 so that shading of the resulting image may be achieved. The lighting system 5 may also include one or more reflectors.

The Cavities 6 are holes in the Sheet 2 which do not penetrate completely through the Sheet 2, but are deep enough to permit light from the lighting system 5 to pass through.

The Sheet 2 may be surrounded on any sides, except the Front surface 3, by an enclosure 9. The lighting system 5 may be enclosed within the enclosure 9.

The Article with Translucent Ornamentation 1 may further comprise a removable compartment adjacent to said Rear surface 4 for enclosing a lighting system 5.

The Article with Translucent Ornamentation 1 may be made by: forming a Sheet 2 of material to a desired size and shape with the Sheet 2 having a front and rear, forming one or more cavities 6 in said Sheet 2 of material, said cavities 6 being of sufficient depth to make the Sheet 2 of material translucent through one or more of said cavities 6, and providing a lighting system 5 to illuminate the Sheet 2 from the rear to cause the translucent portions of the cavities 6 to be illuminated on the front of the Sheet 2.

An alternative embodiment of the Article with Translucent Ornamentation 1 comprises a translucent Sheet 2, a lighting system 5; and an insert 10 having a front 11 and Rear surface 12. The Front surface 11 of the insert 10 is placed closer to the translucent Sheet 2 than the Rear surface 12 of the insert 10. The cavities 6 extend from the rear surface of the insert 10 through the Front surface 3 of the insert 10. The insert 10 is placed between the translucent Sheet 2 and the lighting system 5 with the cavities 6 forming a backlit pattern on said translucent Sheet 2. The insert 10 may be constructed of translucent material, opaque material, or any other material which provides reduced transmission of light.

Alternatively the cavities 6 are of varying depth to produce variations in the intensity of illumination of said backlit pattern. It will be appreciated that the rear surface 12 of the insert 10 may be curved, the insert 10 itself may be curved, the front surface of the insert 11, or the translucent Sheet 2 may be curved, any combination of the translucent Sheet 2, insert 10, front surface of the insert 11, and the rear surface 12 of the insert 10, may be curved. It will also be appreciated that the curvatures of the translucent Sheet 2, insert 10, front surface 11 of the insert, and rear surface 12 of the insert may bear any relationship desired, or no relationship.

I claim:

1. An Article with Translucent Ornamentation, comprising:

a) a sheet having a front and rear surface;

b) a lighting source placed rearward of said rear surface; and c) one or more cavities in said sheet, each said cavity extending from said rear surface toward said front surface sufficiently close to said front surfaced to permit the passage of a portion of the light from said light source passing through said cavity to pass through said front surface, said cavities forming as light pattern on said surface.

2. The Article with Translucent Ornamentation of claim 1 wherein said sheet is planar in shape.

3. The Article with Translucent Ornamentation of claim 1, further comprising:

d) a compartment adjacent to said rear surface for enclosing a lighting source.

4. The Article with Translucent Ornamentation of claim 1 wherein the lighting source further comprises a reflector.

5. The Article with Translucent Ornamentation of claim 1, further comprising:

e) a removable compartment adjacent to said rear surface for enclosing lighting source.

6. The Article with Translucent Ornamentation of claim 1 wherein either the front surface, the rear surface, or both the front surface and the rear surface are curved.

7. A method of making an article of translucent ornamentation, comprising the steps of:

a) Forming a sheet of material to a desired size said sheet having a front and a rear, b) Forming one or more cavities in said sheet of material, said cavities being of sufficient depth to make the sheet of material translucent through one or more of said cavities, and c) Providing a light source placed rearward of said rear surface to illuminate the sheet from the rear to cause the translucent portions of the cavities to be illuminated on the front of the sheet.

8. An Article with Translucent Ornamentation, comprising:

a) a translucent sheet having a front surface and a rear surface;

b) a lighting source placed rearward of said rear surface; and c) an opaque insert having a front surface, a rear surface, and one or more cavities, said opaque insert placed between said translucent sheet and said lighting source with said front surface of said opaque insert being placed closer to said rear surface of said translucent sheet than said rear surface of said translucent sheet, said cavities of said opaque insert extending from said rear surface toward said front t surface of said opaque insert sheet, said cavities of said opaque insert forming a backlit pattern on said front surface of said translucent sheet.

9. The article with translucent ornamentation of claim 8 wherein the cavities are of varying depth to produce variations is intensity of illumination of said backlit pattern.

10. The article with translucent ornamentation of claim 8 wherein said rear surface of said opaque insert is curved.

11. The article with translucent ornamentation of claim 8 wherein said translucent sheet is curved.

12. The Article with Translucent Ornamentation of claim 8 wherein said rear either the front surface of said opaque insert, the rear surface of said opaque insert, or both the front surface of said opaque insert and the rear surface of said opaque insert are curved.

* * * * *